(12) United States Patent
Montena et al.

(10) Patent No.: US 9,362,686 B2
(45) Date of Patent: Jun. 7, 2016

(54) INTERFACE TERMINATING DEVICE

(71) Applicant: PPC Broadband, Inc., East Syracuse, NY (US)

(72) Inventors: Noah P. Montena, Syracuse, NY (US); Brian K. Hanson, East Syracuse, NY (US)

(73) Assignee: PPC Broadband, Inc., East Syracuse, NY (US)

( * ) Notice: Subject to any disclaimer, the term of this patent is extended or adjusted under 35 U.S.C. 154(b) by 41 days.

(21) Appl. No.: 14/268,521

(22) Filed: May 2, 2014

(65) Prior Publication Data
US 2014/0329411 A1 Nov. 6, 2014

Related U.S. Application Data

(60) Provisional application No. 61/818,932, filed on May 3, 2013.

(51) Int. Cl.
*H01R 24/44* (2011.01)
*H01R 13/66* (2006.01)
*H01R 4/32* (2006.01)
*H01P 1/26* (2006.01)

(52) U.S. Cl.
CPC ............ *H01R 13/6616* (2013.01); *H01R 24/44* (2013.01); *H01P 1/266* (2013.01); *H01R 4/32* (2013.01)

(58) Field of Classification Search
CPC ........... H01R 13/6616; H01R 13/5205; H01R 13/625
See application file for complete search history.

(56) References Cited

U.S. PATENT DOCUMENTS

| 3,768,063 | A | | 10/1973 | Coffman | |
|---|---|---|---|---|---|
| 3,784,950 | A | * | 1/1974 | Coffman | ...................... 338/200 |
| 4,838,813 | A | * | 6/1989 | Pauza | ..................... H01R 24/42 333/22 R |
| 5,237,293 | A | | 8/1993 | Kan et al. | |
| 5,435,736 | A | | 7/1995 | McMills et al. | |
| 5,632,637 | A | | 5/1997 | Diener | |
| 5,904,596 | A | | 5/1999 | Knaus et al. | |
| D495,661 | S | | 9/2004 | Chawgo | |
| D495,662 | S | | 9/2004 | Chawgo | |
| D495,663 | S | | 9/2004 | Chawgo | |
| 7,287,992 | B2 | | 10/2007 | Chawgo | |
| 7,452,239 | B2 | | 11/2008 | Montena | |
| 7,727,012 | B2 | | 6/2010 | Montena et al. | |
| 8,062,044 | B2 | * | 11/2011 | Montena | ................. H01P 1/266 439/277 |
| 8,070,504 | B2 | | 12/2011 | Amidon et al. | |
| 8,235,751 | B2 | | 8/2012 | Amidon et al. | |
| 8,317,538 | B2 | * | 11/2012 | Carle | ................. H01R 13/6616 439/548 |
| 8,414,322 | B2 | | 4/2013 | Montena | |
| 2004/0014363 | A1 | * | 1/2004 | Khemakhem et al. | ........ 439/620 |
| 2004/0219838 | A1 | * | 11/2004 | Kooiman | ................ H01P 1/266 439/620.1 |
| 2007/0010117 | A1 | * | 1/2007 | Silver | ................... H01R 13/703 439/188 |

(Continued)

OTHER PUBLICATIONS

PCT/US2014/036622; International Filing Date May 2, 2014; International Search Report and Written Opinion; Date of Mailing Sep. 2, 2014; (7 pages).

*Primary Examiner* — Truc Nguyen
(74) *Attorney, Agent, or Firm* — Barclay Damon, LLP

(57) ABSTRACT

An interface terminating device for an interface port includes, in one embodiment, a resistor having first and second conductive leads and a resistive element between the first and second leads. The interface terminating device includes a resistor holder and resistor engager which cooperate together to establish electrical contact with an interface port.

28 Claims, 11 Drawing Sheets

(56) References Cited

U.S. PATENT DOCUMENTS

| | | |
|---|---|---|
| 2007/0099456 A1 | 5/2007 | Chawgo |
| 2008/0026615 A1* | 1/2008 | Low .................. H01R 24/44 439/137 |
| 2008/0102697 A1 | 5/2008 | Montena et al. |
| 2008/0102704 A1 | 5/2008 | Montena |
| 2009/0117766 A1* | 5/2009 | Khemakhem ........ H01R 13/518 439/188 |
| 2010/0279548 A1 | 11/2010 | Montena et al. |
| 2010/0323541 A1 | 12/2010 | Amidon et al. |
| 2012/0021618 A1* | 1/2012 | Schultz ................ H01R 13/719 439/38 |
| 2012/0064766 A1 | 3/2012 | Amidon et al. |
| 2012/0145454 A1 | 6/2012 | Montena |
| 2013/0029522 A1 | 1/2013 | Holliday et al. |
| 2013/0090010 A1* | 4/2013 | Darrow .................... H02H 9/06 439/620.03 |

* cited by examiner

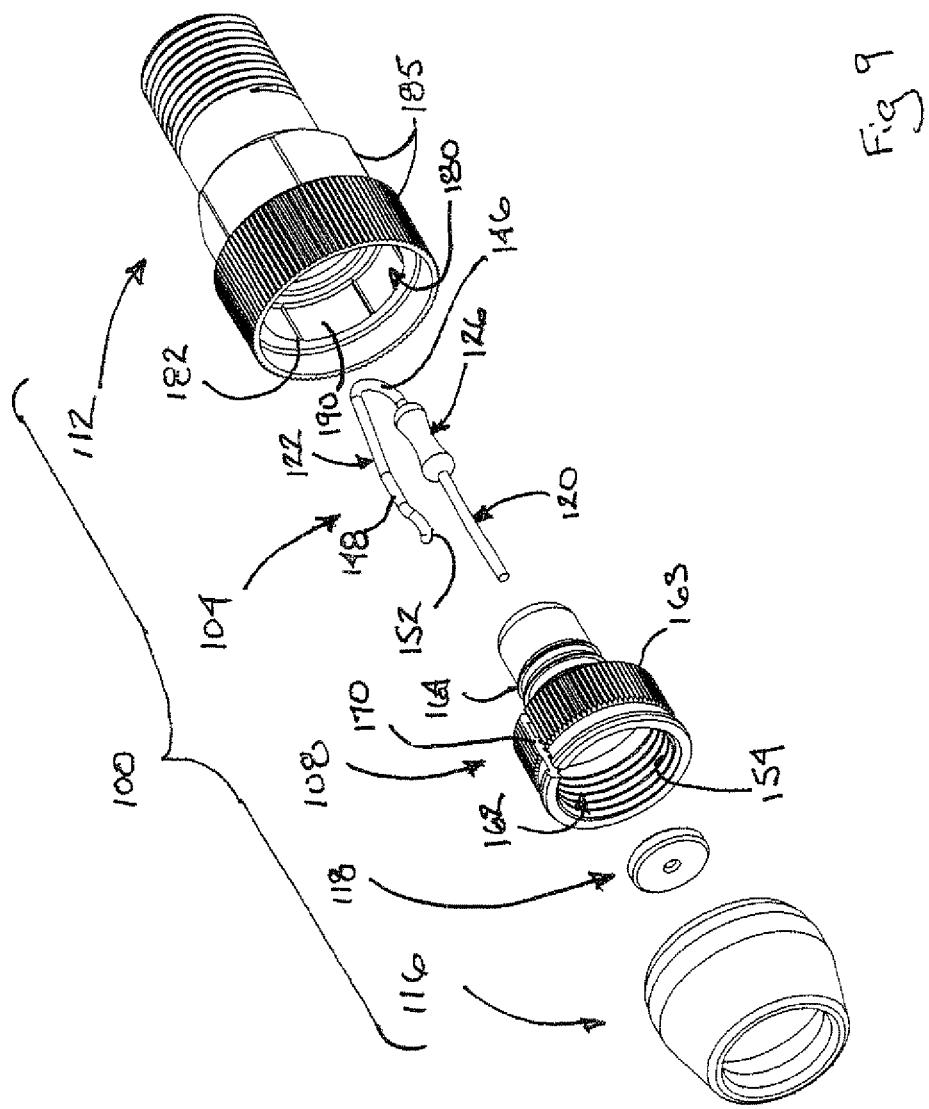

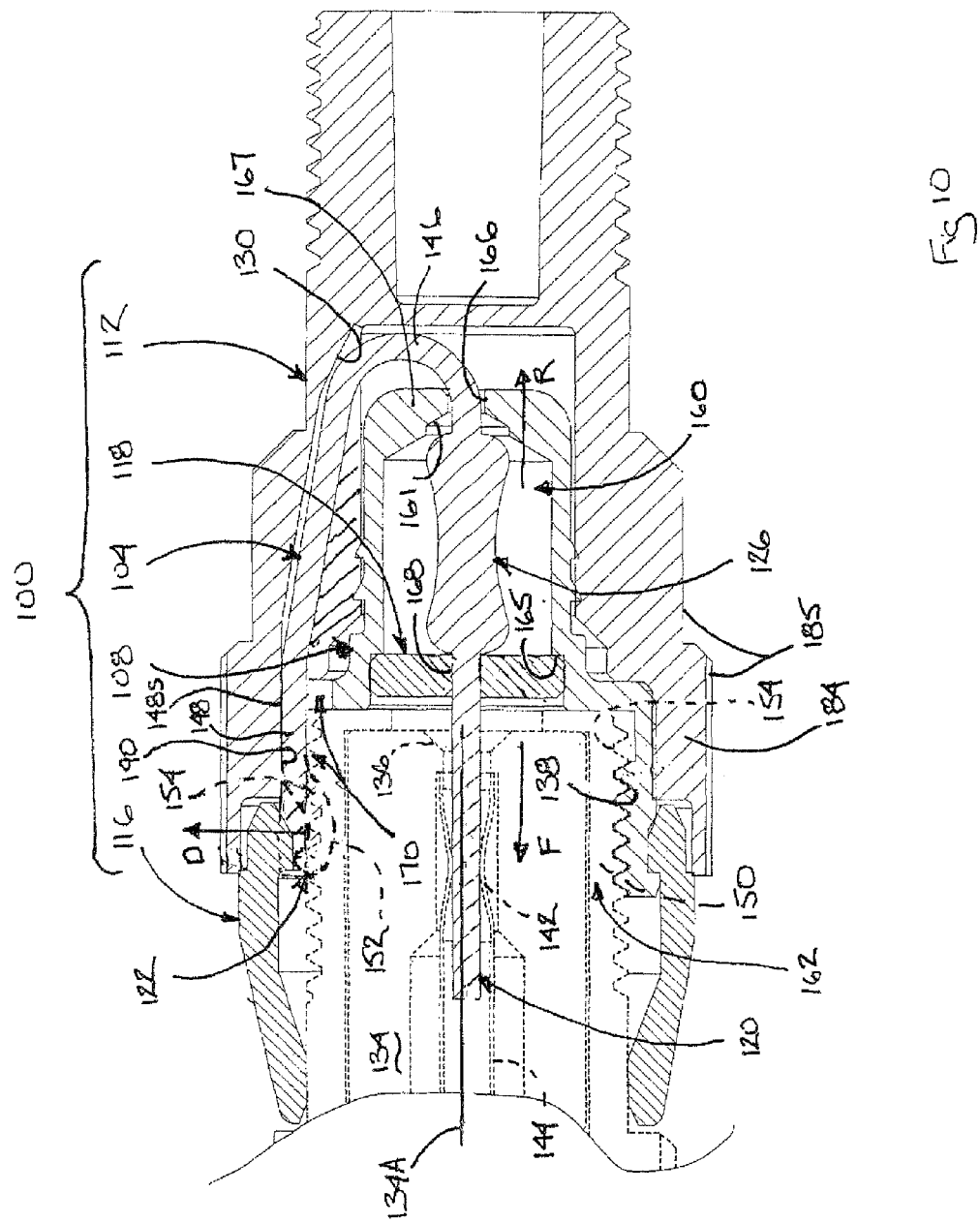

INTERFACE TERMINATING DEVICE

PRIORITY CLAIM

This application is a non-provisional of, and claims the benefit and priority of, U.S. Provisional Patent Application No. 61/818,932, filed on May 3, 2013. The entire contents of such application are hereby incorporated by reference.

BACKGROUND

Unused coaxial cable mating ports or other cable ends that are not terminated can produce unwanted RF signals that can cause interference in a coaxial cable system. Thus, it is known in the art to connect a terminating cap to an unused coaxial cable mating port. The typical cap includes a threaded metallic housing that engages the threads of the mating port. The cap further includes a resistor soldered to the metallic housing. The resistor is connected to another metallic portion which bends into a center opening of the unused coaxial cable mating port.

This known cap has several drawbacks. The resistor and the housing require a manufacturing step of soldering, which can be a costly, labor intensive process. The solder seam can fracture during use. The soldering material can degrade the electrical performance of the resistor. Also, the housing is an additional part in the conductive path, i.e., between the resistor and the mating port, creating an opportunity for malfunction or failure.

Therefore, there is a need to overcome, or otherwise lessen the effects of, the disadvantages and shortcomings described above.

SUMMARY

In one embodiment, an interface terminating device has a resistor, a resistor holder configured to receive the resistor, and a resistor engager configured to engage a conductive lead of the resistor, forcing it into engagement with a conductor of a coaxial interface port. More specifically, the resistor comprises a first conductive lead, a second conductive lead, and a resistive element between the first and second conductive leads. The resistor holder is configured to hold the resistor so that the first conductive lead is directed to engage an inner conductor of a coaxial interface port. The resistor engager is configured to: (i) engage the second conductor lead of the resistor, and (ii) urge the second conductive lead into engagement with an outer conductor of the coaxial interface port.

In another embodiment, a method is provided for preparing a terminating device for an interface port. The method comprises the steps of securing a resistive element in a resistor holder including a retention cavity and a threaded cavity. The retention cavity has: (i) a first opening facing forward toward the interface port and (ii) a second opening facing rearwardly away from the interface port. The first opening receives a first conductive lead and the second opening receives a second conductive lead. In a next step, the second conductive lead is turned or bent from a rearward position to a forward position into a slot of the resistor holder which slot extends through the wall structure of the threaded cavity. In a final step, a resistor engager is fit over the resistor holder such that the resistor engager envelops the resistor holder. In this step, the second conductive lead forcibly engages an outer surface of the interface port to augment the electrical connectivity or continuity between the second conductive lead and the interface port.

Additional features and advantages of the present disclosure are described in, and will be apparent from, the following Brief Description of the Drawings and Detailed Description.

BRIEF DESCRIPTION OF THE DRAWINGS

FIG. 9 is an isometric exploded view of an interface terminating device for a coaxial cable interface port according to one embodiment including a resistor, a resistor holder and a resistor engager.

FIG. 10 is a cross-sectional view of the interface terminating device shown in FIG. 9 after assembly.

DETAILED DESCRIPTION

Network and Interfaces

Figure 1:
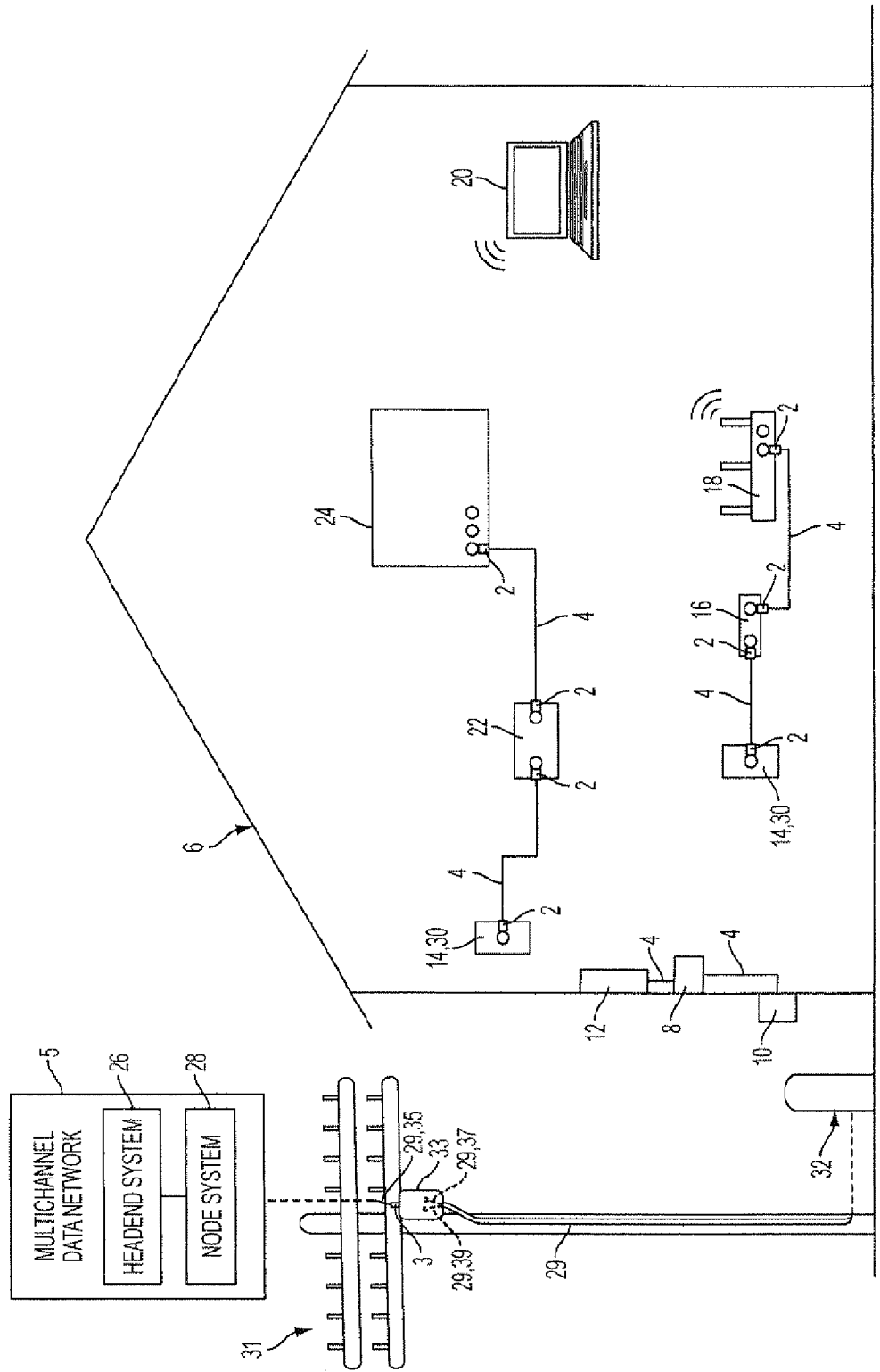
FIG. 1 is a schematic diagram illustrating an environment coupled to a multichannel data network.

Referring to FIG. 1, cable connectors 2 and 3 enable the exchange of data signals between a broadband network or multichannel data network 5, and various devices within a home, building, venue or other environment 6. For example, the environment's devices can include: (a) a point of entry ("PoE") filter 8 operatively coupled to an outdoor cable junction device 10; (b) one or more signal splitters within a service panel 12 which distributes the data service to interface ports 14 of various rooms or parts of the environment 6; (c) a modem 16 which modulates radio frequency ("RF") signals to generate digital signals to operate a wireless router 18; (d) an Internet accessible device, such as a mobile phone or computer 20, wirelessly coupled to the wireless router 18; and (e) a set-top unit 22 coupled to a television ("TV") 24. In one embodiment, the set-top unit 22, typically supplied by the data provider (e.g., the cable TV company), includes a TV tuner and a digital adapter for High Definition TV.

In one distribution method, the data service provider operates a headend facility or headend system 26 coupled to a plurality of optical node facilities or node systems, such as node system 28. The data service provider operates the node systems as well as the headend system 26. The headend system 26 multiplexes the TV channels, producing light beam pulses which travel through optical fiber trunklines. The optical fiber trunklines extend to optical node facilities in local communities, such as node system 28. The node system 28 translates the light pulse signals to RF electrical signals.

In one embodiment, a drop line coaxial cable or weather-protected or weatherized coaxial cable 29 is connected to the headend facility 26 or node facility 28 of the service provider. In the example shown, the weatherized coaxial cable 29 is routed to a standing structure, such as utility pole 31. A splitter or entry junction device 33 is mounted to, or hung from, the utility pole 31. In the illustrated example, the entry junction device 33 includes an input data port or input tap for receiving a hardline connector or pin-type connector 3. The entry junction box device 33 also includes a plurality of output data ports within its weatherized housing. It should be appreciated that such a junction device can include any suitable number of input data ports and output data ports.

The end of the weatherized coaxial cable 35 is attached to a hardline connector or pin-type connector 3, which has a protruding pin insertable into a female interface data port of the junction device 33. The ends of the weatherized coaxial cables 37 and 39 are each attached to one of the connectors 2 described below. In this way, the connectors 2 and 3 electrically couple the cables 35, 37 and 39 to the junction device 33.

In one embodiment, the pin-type connector 3 has a male shape which is insertable into the applicable female input tap or female input data port of the junction device 33. The two female output ports of the junction device 33 are female-shaped in that they define a central hole configured to receive, and connect to, the inner conductors of the connectors 2.

In one embodiment, each input tap or input data port of the entry junction device 33 has an internally threaded wall configured to be threadably engaged with one of the pin-type connectors 3. The network 5 is operable to distribute signals through the weatherized coaxial cable 35 to the junction device 33, and then through the pin-type connector 3. The junction device 33 splits the signals to the pin-type connectors 2, weatherized by an entry box enclosure, to transmit the signals through the cables 37 and 39, down to the distribution box 32 described below.

In another distribution method, the data service provider operates a series of satellites. The service provider installs an outdoor antenna or satellite dish at the environment 6. The data service provider connects a coaxial cable to the satellite dish. The coaxial cable distributes the RF signals or channels of data into the environment 6.

In one embodiment, the multichannel data network 5 includes a telecommunications, cable/satellite TV ("CATV") network operable to process and distribute different RF signals or channels of signals for a variety of services, including, but not limited to, TV, Internet and voice communication by phone. For TV service, each unique radio frequency or channel is associated with a different TV channel. The set-top unit 22 converts the radio frequencies to a digital format for delivery to the TV. Through the data network 5, the service provider can distribute a variety of types of data, including, but not limited to, TV programs including on-demand videos, Internet service including wireless or WiFi Internet service, voice data distributed through digital phone service or Voice Over Internet Protocol (VoIP) phone service, Internet Protocol TV ("IPTV") data streams, multimedia content, audio data, music, radio and other types of data.

In one embodiment, the multichannel data network 5 is operatively coupled to a multimedia home entertainment network serving the environment 6. In one example, such multimedia home entertainment network is the Multimedia over Coax Alliance ("MoCA") network. The MoCA network increases the freedom of access to the data network 5 at various rooms and locations within the environment 6. The MoCA network, in one embodiment, operates on cables 4 within the environment 6 at frequencies in the range 1125 MHz to 1675 MHz. MoCA compatible devices can form a private network inside the environment 6.

In one embodiment, the MoCA network includes a plurality of network-connected devices, including, but not limited to: (a) passive devices, such as the PoE filter 8, internal filters, diplexers, traps, line conditioners and signal splitters; and (b) active devices, such as amplifiers. The PoE filter 8 provides security against the unauthorized leakage of a user's signal or network service to an unauthorized party or non-serviced environment. Other devices, such as line conditioners, are operable to adjust the incoming signals for better quality of service. For example, if the signal levels sent to the set-top box 22 do not meet designated flatness requirements, a line conditioner can adjust the signal level to meet such requirement.

In one embodiment, the modem 16 includes a monitoring module. The monitoring module continuously or periodically monitors the signals within the MoCA network. Based on this monitoring, the modem 16 can report data or information back to the headend system 26. Depending upon the embodiment, the reported information can relate to network problems, device problems, service usage or other events.

At different points in the network 5, cables 4 and 29 can be located indoors, outdoors, underground, within conduits, above ground mounted to poles, on the sides of buildings and within enclosures of various types and configurations. Cables 29 and 4 can also be mounted to, or installed within, mobile environments, such as land, air and sea vehicles.

As described above, the data service provider uses coaxial cables 29 and 4 to distribute the data to the environment 6. The environment 6 has an array of coaxial cables 4 at different locations. The connectors 2 are attachable to the coaxial cables 4. The cables 4, through use of the connectors 2, are connectable to various communication interfaces within the environment 6, such as the female interface ports 14 illustrated in FIGS. 1-2. In the examples shown, female interface ports 14 are incorporated into: (a) a signal splitter within an outdoor cable service or distribution box 32 which distributes data service to multiple homes or environments 6 close to each other; (b) a signal splitter within the outdoor cable junction box or cable junction device 10 which distributes the data service into the environment 6; (c) the set-top unit 22; (d) the TV 24; (e) wall-mounted jacks, such as a wall plate; and (f) the router 18.

Figure 2:
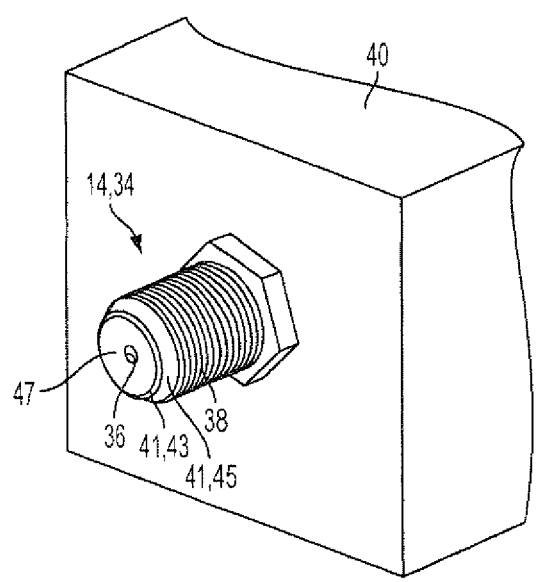
FIG. 2 is an isometric view of one embodiment of a female interface port which is configured to be operatively coupled to the multichannel data network.
Figure 4:
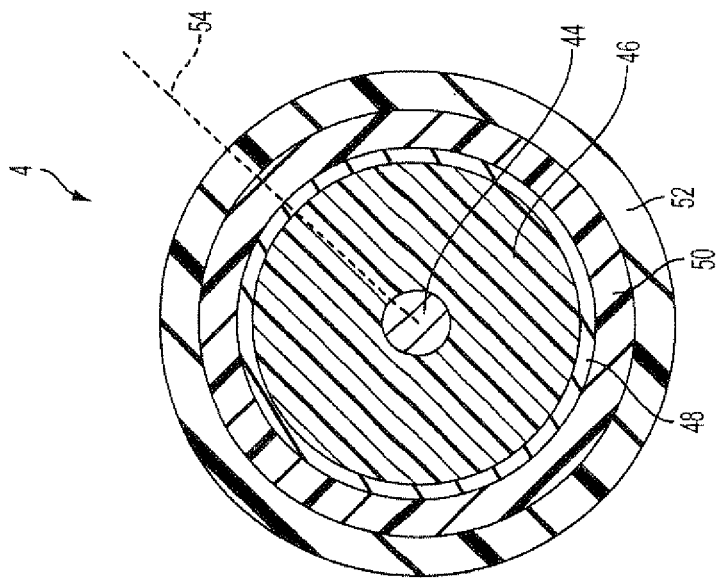
FIG. 4 is a cross-sectional view of the cable of FIG. 3, taken substantially along line 4-4.

In one embodiment, each of the female interface ports 14 includes a stud or jack, such as the cylindrical stud 34 illustrated in FIG. 2. The cylindrical stud 34 is ready for connection to one of the coaxial cable connectors 2, 3 and has not been capped, or terminated, by a solderless terminating device according to another embodiment described in greater detail hereinafter. Further, the stud 34 has: (a) an inner, cylindrical wall 36 defining a central hole configured to receive an electrical contact, wire, pin, conductor (not shown) positioned within the central hole; (b) a conductive, threaded outer surface 38; (c) a conical conductive region 41 having conductive contact sections 43 and 45; and (d) a dielectric or insulation material 47.

In one embodiment, stud 34 is shaped and sized to be compatible with the F-type coaxial connection standard. It should be understood that, depending upon the embodiment, stud 34 could have a smooth outer surface. The stud 34 can be operatively coupled to, or incorporated into, a device 40 which can include, for example, a cable splitter of a distribution box 32, outdoor cable junction box 10 or service panel 12; a set-top unit 22; a TV 24; a wall plate; a modem 16; a router 18; or the junction device 33.

During installation, the installer couples a cable 4 to an interface port 14 by screwing or pushing the connector 2 onto the female interface port 34. Once installed, the connector 2 receives the female interface port 34. The connector 2 establishes an electrical connection between the cable 4 and the electrical contact of the female interface port 34.

After installation, the connectors 2 often undergo various forces. For example, there may be tension in the cable 4 as it stretches from one device 40 to another device 40, imposing a steady, tensile load on the connector 2. A user might occasionally move, pull or push on a cable 4 from time to time, causing forces on the connector 2. Alternatively, a user might swivel or shift the position of a TV 24, causing bending loads on the connector 2. As described below, the connector 2 is structured to maintain a suitable level of electrical connectivity despite such forces.

Cable

Referring to FIGS. 3-6, the coaxial cable 4 extends along a cable axis or a longitudinal axis 42. In one embodiment, the cable 4 includes: (a) an elongated center conductor or inner conductor 44; (b) an elongated insulator 46 coaxially surrounding the inner conductor 44; (c) an elongated, conductive foil layer 48 coaxially surrounding the insulator 46; (d) an elongated outer conductor 50 coaxially surrounding the foil layer 48; and (e) an elongated sheath, sleeve or jacket 52 coaxially surrounding the outer conductor 50.

The inner conductor 44 is operable to carry data signals to and from the data network 5. Depending upon the embodiment, the inner conductor 44 can be a strand, a solid wire or a hollow, tubular wire. The inner conductor 44 is, in one embodiment, constructed of a conductive material suitable for data transmission, such as a metal or alloy including copper, including, but not limited to, copper-clad aluminum ("CCA"), copper-clad steel ("CCS") or silver-coated copper-clad steel ("SCCCS").

The insulator 46, in one embodiment, is a dielectric having a tubular shape. In one embodiment, the insulator 46 is radially compressible along a radius or radial line 54, and the insulator 46 is axially flexible along the longitudinal axis 42. Depending upon the embodiment, the insulator 46 can be a suitable polymer, such as polyethylene ("PE") or a fluoropolymer, in solid or foam form.

Figure 3:
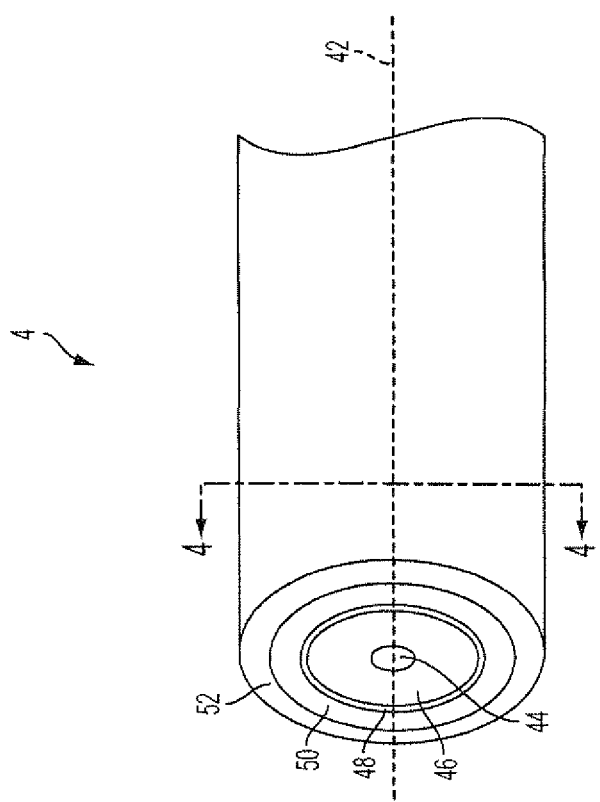
FIG. 3 is an isometric view of one embodiment of a coaxial cable which is configured to be operatively coupled to the multichannel data network.

In the embodiment illustrated in FIG. 3, the outer conductor 50 includes a conductive RF shield or electromagnetic radiation shield. In such embodiment, the outer conductor 50 includes a conductive screen, mesh or braid or otherwise has a perforated configuration defining a matrix, grid or array of openings. In one such embodiment, the braided outer conductor 50 has an aluminum material or a suitable combination of aluminum and polyester. Depending upon the embodiment, cable 4 can include multiple, overlapping layers of braided outer conductors 50, such as a dual-shield configuration, tri-shield configuration or quad-shield configuration.

In one embodiment, as described below, the connector 2 electrically grounds the outer conductor 50 of the coaxial cable 4. When the inner conductor 44 and external electronic devices generate magnetic fields, the grounded outer conductor 50 sends the excess charges to ground. In this way, the outer conductor 50 cancels all, substantially all or a suitable amount of the potentially interfering magnetic fields. Therefore, there is less, or an insignificant, disruption of the data signals running through inner conductor 44. Also, there is less, or an insignificant, disruption of the operation of external electronic devices near the cable 4.

In such embodiment, the cable 4 has two electrical grounding paths. The first grounding path runs from the inner conductor 44 to ground. The second grounding path runs from the outer conductor 50 to ground.

The conductive foil layer 48, in one embodiment, is an additional, tubular conductor which provides additional shielding of the magnetic fields. In one embodiment, the foil layer 48 includes a flexible foil tape or laminate adhered to the insulator 46, assuming the tubular shape of the insulator 46. The combination of the foil layer 48 and the outer conductor 50 can suitably block undesirable radiation or signal noise from leaving the cable 4. Such combination can also suitably block undesirable radiation or signal noise from entering the cable 4. This can result in an additional decrease in disruption of data communications through the cable 4 as well as an additional decrease in interference with external devices, such as nearby cables and components of other operating electronic devices.

In one embodiment, the jacket 52 has a protective characteristic, guarding the cable's internal components from damage. The jacket 52 also has an electrical insulation characteristic. In one embodiment, the jacket 52 is compressible along the radial line 54 and is flexible along the longitudinal axis 42. The jacket 52 is constructed of a suitable, flexible material such as polyvinyl chloride (PVC) or rubber. In one embodiment, the jacket 52 has a lead-free formulation including black-colored PVC and a sunlight resistant additive or sunlight resistant chemical structure.

Figure 5:
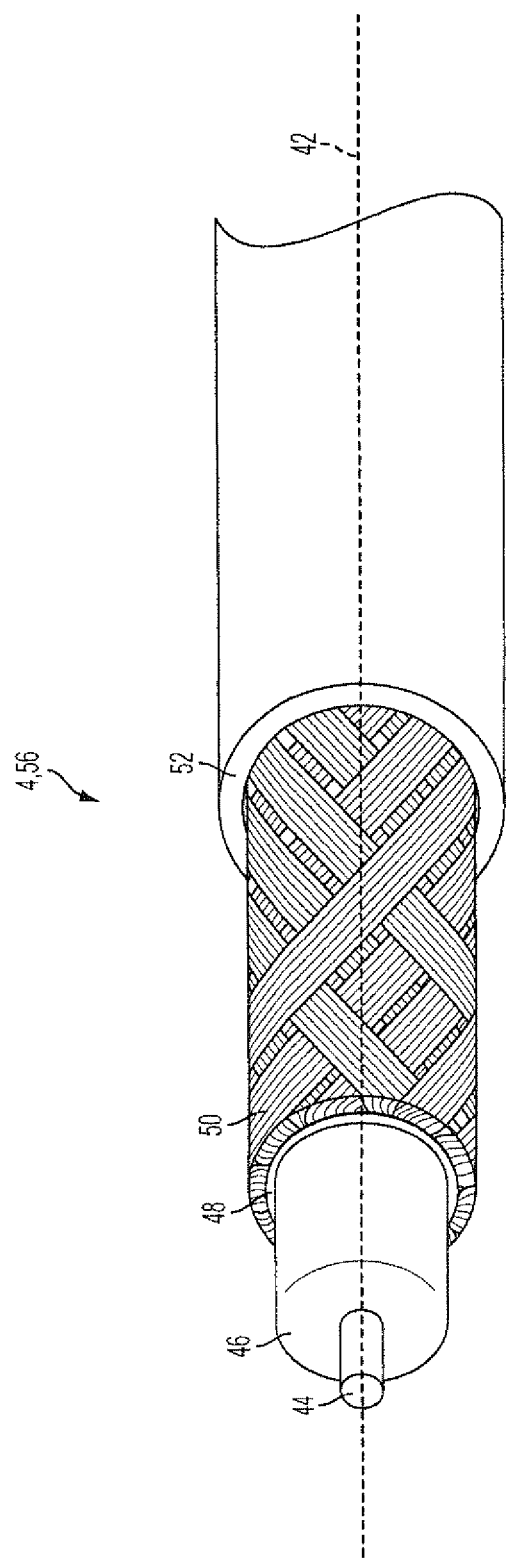
FIG. 5 is an isometric view of one embodiment of a coaxial cable which is configured to be operatively coupled to the multichannel data network, illustrating a three step shaped configuration of a prepared end of the coaxial cable.
Figure 6:
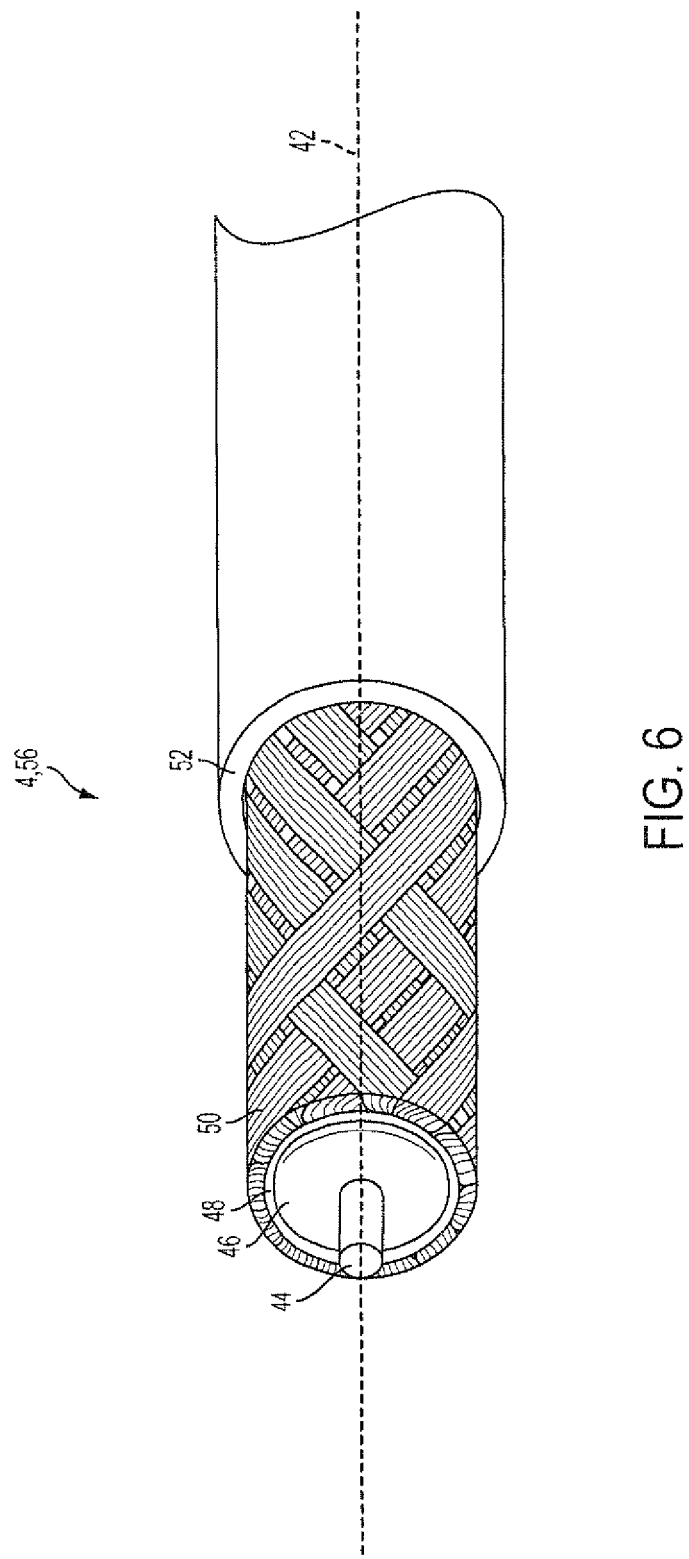
FIG. 6 is an isometric view of one embodiment of a coaxial cable which is configured to be operatively coupled to the multichannel data network, illustrating a two step shaped configuration of a prepared end of the coaxial cable.

Referring to FIGS. 5-6, in one embodiment an installer or preparer prepares a terminal end 56 of the cable 4 so that it can be mechanically connected to the connector 2. To do so, the preparer removes or strips away differently sized portions of the jacket 52, outer conductor 50, foil 48 and insulator 46 so as to expose the side walls of the jacket 52, outer conductor 50, foil layer 48 and insulator 46 in a stepped or staggered fashion. In the example shown in FIG. 5, the prepared end 56 has a three step-shaped configuration. In the example shown in FIG. 6, the prepared end 58 has a two step-shaped configuration. The preparer can use cable preparation pliers or a cable stripping tool to remove such portions of the cable 4. At this point, the cable 4 is ready to be connected to the connector 2.

Figure 7:
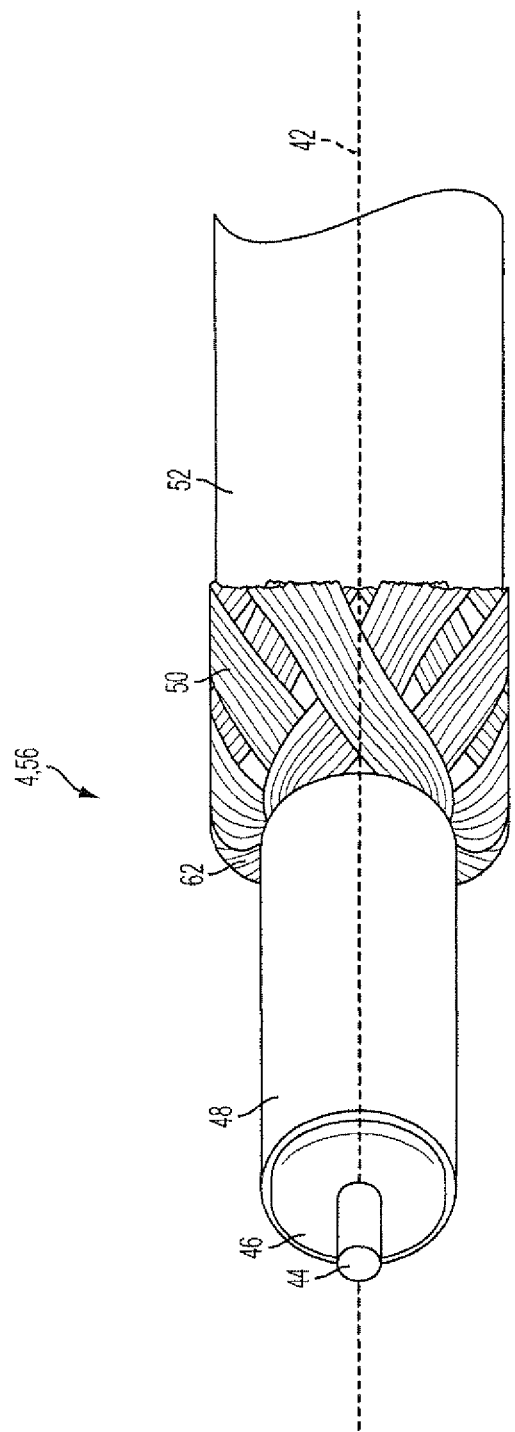
FIG. 7 is an isometric view of one embodiment of a coaxial cable which is configured to be operatively coupled to the multichannel data network, illustrating the folded-back, braided outer conductor of a prepared end of the coaxial cable.

In one embodiment illustrated in FIG. 7, the installer or preparer performs a folding process to prepare the cable 4 for connection to connector 2. In the example illustrated, the preparer folds the braided outer conductor 50 backward onto the jacket 52. As a result, the folded section 60 is oriented inside out. The bend or fold 62 is adjacent to the foil layer 48 as shown. Certain embodiments of the connector 2 include a tubular post. In such embodiments, this folding process can facilitate the insertion of such post in between the braided outer conductor 50 and the foil layer 48.

Depending upon the embodiment, the components of the cable 4 can be constructed of various materials which have some degree of elasticity or flexibility. The elasticity enables the cable 4 to flex or bend in accordance with broadband communications standards, installation methods or installation equipment. Also, the radial thicknesses of the cable 4, the inner conductor 44, the insulator 46, the conductive foil layer 48, the outer conductor 50 and the jacket 52 can vary based upon parameters corresponding to broadband communication standards or installation equipment.

Figure 8:
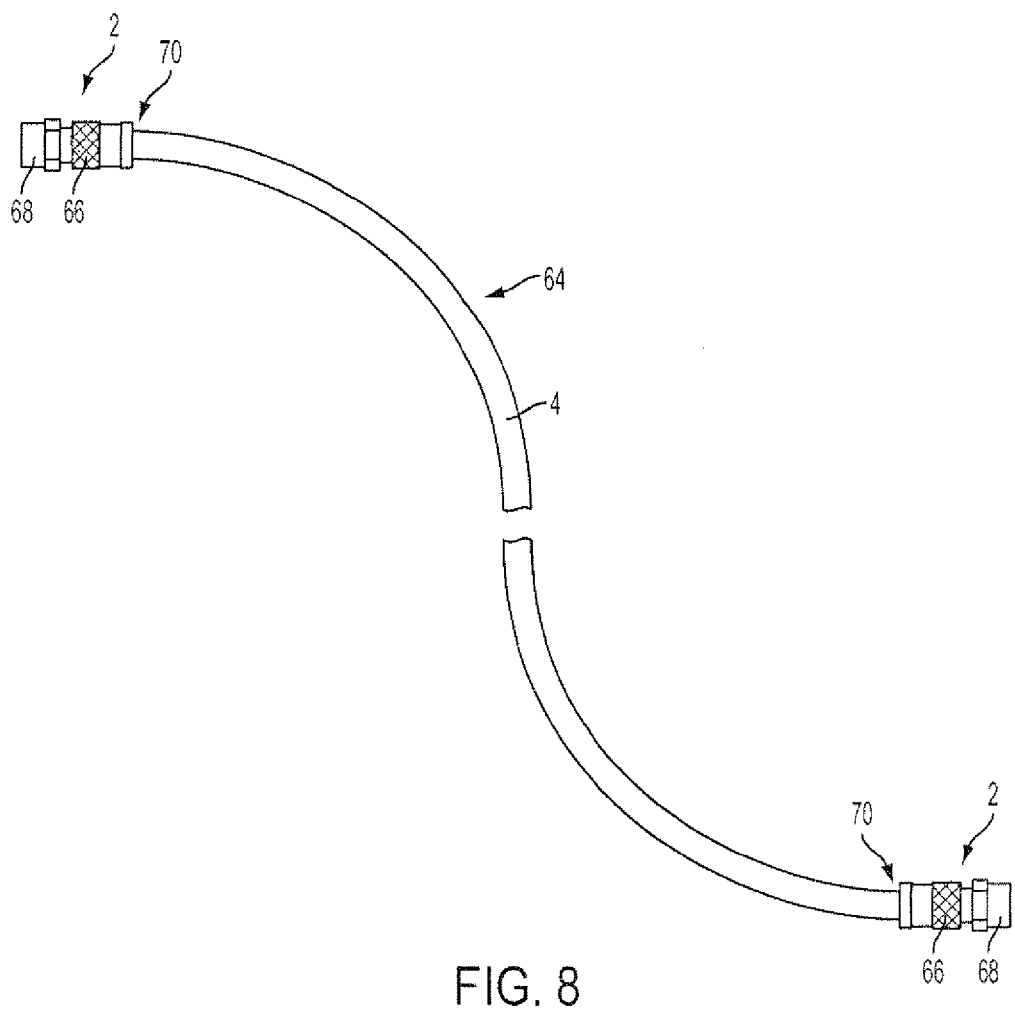
FIG. 8 is a top view of one embodiment of a coaxial cable jumper or cable assembly which is configured to be operatively coupled to the multichannel data network

In one embodiment illustrated in FIG. 8, a cable jumper or cable assembly 64 includes a combination of the connector 2 and the cable 4 attached to the connector 2. In this embodiment, the connector 2 includes: (a) a connector body or connector housing 66; and (b) a fastener or coupler 68, such as a threaded nut, which is rotatably coupled to the connector housing 66. The cable assembly 64 has, in one embodiment, connectors 2 on both of its ends 70. Preassembled cable jumpers or cable assemblies 64 can facilitate the installation of cables 4 for various purposes.

In one embodiment the weatherized coaxial cable 29, illustrated in FIG. 1, has the same structure, configuration and components as coaxial cable 4 except that the weatherized coaxial cable 29 includes additional weather protective and durability enhancement characteristics. These characteristics enable the weatherized coaxial cable 29 to withstand greater forces and degradation factors caused by outdoor exposure to weather.

Interface Terminating Device

As mentioned in the Background of this disclosure, it can be desirable to electrically terminate an unused end of an interface port. An example of one such port of the type 14, 34 is illustrated and described herein is shown in FIG. 2. The need for termination arises from original or residual RF energy can emanate from an open (i.e., non-terminated) interface port which is internally connected to an operating RF device but externally exposed.

Referring to FIG. 9, an exploded view of an interface terminating device 100 is shown. The interface terminating device 100 includes: (a) a resistor or resistor device 104; (b) an inner body, resistor guide, resistor retainer or resistor holder 108; and (c) an outer body, resistor driver, resistor compressor or resistor engager 112. In other embodiments, the interface terminating device 100 may include a protective cover, environmental seal or cap 116 for the purposes of protecting the device 100 from inclement weather conditions and a resistor lead aligner, resistor lead holder or resistor lead centering device 118, such as a disc-shaped insulator configured to receive and center a conductive lead 120 of the resistor device 104.

While the interface terminating device 100 is shown as including several components each having a particular function, it will be appreciated that the structure of one element may be incorporated into another element to perform the requisite function. For example, the resistor holder 108 may include structure which performs an engaging function. In yet another example, the resistor engager 112 may include structure which performs the holding and retaining function of the resistor holder 108. Furthermore, the functions associated with the resistor holder and engager may be viewed as parts of an overall housing structure. Consequently, the terminating device 100 may include a housing 108, 112 having resistor holder portion 108 and resistor engager 112. Furthermore, the resistor holder and engager 108, 112 may cooperate to perform one or both functions and may be integrated into a multi-element housing structure.

The resistor or resistor device 104 comprises a first conductive lead 120, a second conductive lead 122 and a resistive element 126 between the first and second conductive leads 120, 122. The first conductive lead 120 extends in a first or forward direction F from the resistive element 126 toward the interface port 134 (shown in phantom in FIG. 10). The second conductive lead 122 initially extends in a second or rearward direction R, but is redirected by a guide surface 130 of the resistor engager 112 when assembled in combination with the resistor 104.

In the described embodiment, the resistor holder 108 holds the resistor device 104 so that the first conductive lead 120 is aligned with an axis 134A of the port 134134 and is configured to electrically engage an inner conductor 144 (also shown in phantom lines in FIG. 10) of the interface port 134 through a conductive aperture 136. The conductive hole or aperture 136 of the interface port 134 may include a conductive throat section 142 having a diameter which is smaller than the diameter of the first conductive lead 120 to augment the coupling forces therebetween. The first conductive lead 120 may be fabricated from the same material as the inner conductor 144 of a typical coaxial cable 4. For example, the conductive lead 120 may be manufactured from copper or a copper plated steel wire.

Figure 13:
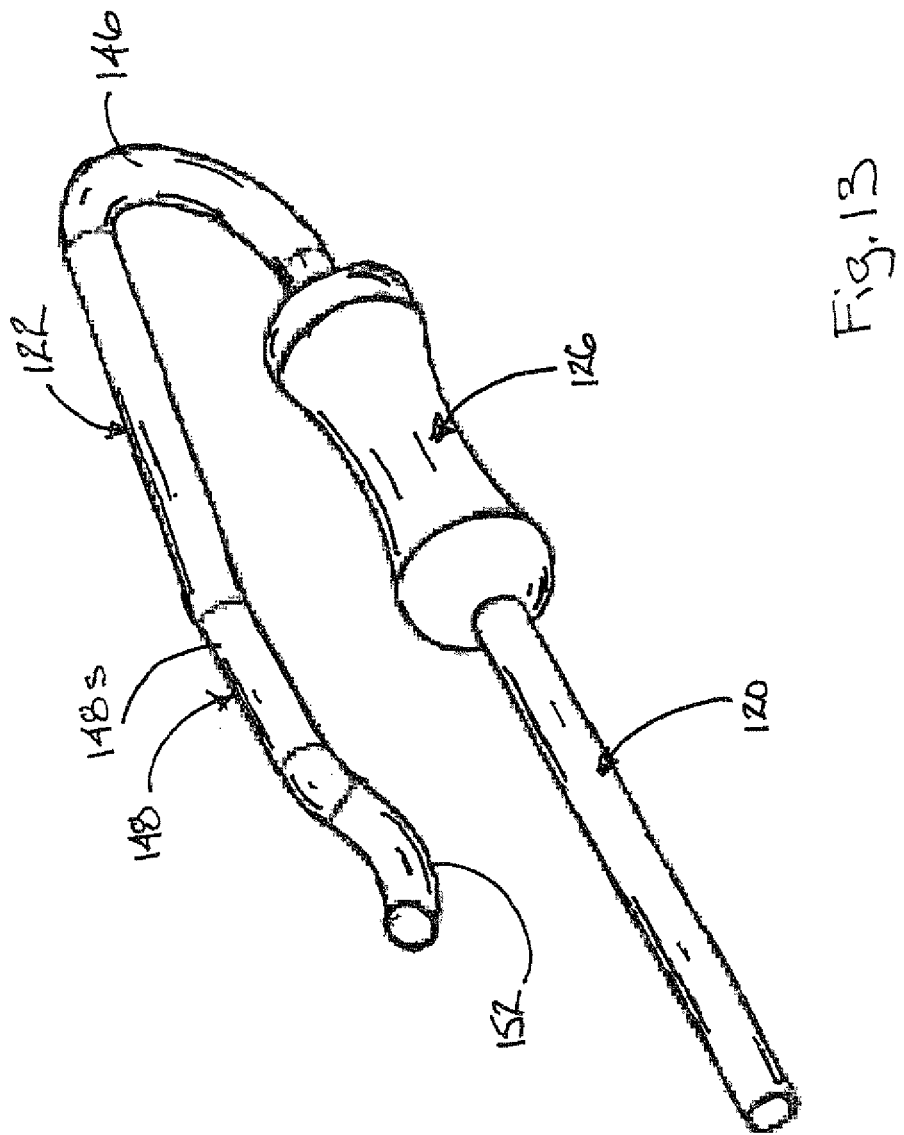
FIG. 13 is an enlarged isometric view of the resistor including a first and second conductive lead and a resistive element disposed between the first and second conductive leads.

Referring to FIGS. 9 and 13, the second conductive lead 122 is flexible and includes a bent, U-shaped or an arcuate portion 146 which bends rearwardly and then forwardly with respect to the resistive element 126. A forward end 148 of the second conductive lead 122 is configured to be directed alongside the outer surface 138 of the interface port 134. More specifically, the forward end 148 is positioned adjacent the threaded outer surface 138 and includes, in one embodiment, a radial extender or a radially, inwardly-curved, spring-biased end portion 152 which serves to augment or intensify the frictional forces engagement between the forward end 148 and the outer surface 138 of the interface port 134. In one embodiment, the arcuate portion 146 has a spring characteristic which generates a spring force which acts radially inward relative to the axis 134A. In the described embodiment, it will be appreciated that the second conductive lead 122 may be longer than the first conductive lead 120 to accommodate the geometric bend of the arcuate portion 146. In other embodiments, the second conductive lead 122 may be the same length or longer than the first conductive lead 120.

In one embodiment, each resistor lead 120 and 122 is an integral wire excluding any added soldered or welded components or structures. Put another way, each resistor lead 120 and 122 is a solder-less or solder-free resistor lead.

The resistive element 126 is configured to match the impedance, i.e., making the load impedance substantially equal to the source impedance, for the purpose of reducing internal reflection. To match the impedance, the resistive element 126 includes a partially conductive element, e.g., a combination of carbon and ceramic materials or a metal film resistor, which steps down the voltage between the first and second conductive leads 120, 122. Depending on the type of interface or coaxial cable, the resistive element 126 may have a resistance in Ohms of about 75 Ohms.

The resistor holder 108 includes an opening comprising first and second cavities 160, 162 for receiving the resistor 104. More specifically, the first cavity 160 includes at least one conical surface 161 for centering an end of the resistive element 126 within the cavity 162. The second cavity 162 also receives the resistor 104 but has a larger diameter to define an internally threaded coupling surface 154, i.e., a surface 154 which engages the externally threaded outer coupling surface 138 of the interface port. A plurality of axial grooves 163 are formed along the external peripheral surface of the second cavity 162, and a plurality of circumferential ridges 164 are formed along the external peripheral surface of the second cavity 162. These structural features will become evident when discussing the assembly and operation of the terminating device 100.

The first cavity 160 includes a forward lip 165 to engage an edge of the disc-shaped insulator or lead aligner 118 and a second conductive lead aperture 166 to facilitate the passage of the second conductive lead 122. The second conductive lead aperture 166 is located at the center or apex of the conical surface 161 through a base wall 167 of the first cavity 160. The disc-shaped insulator or lead aligner 118 includes a second conductive lead aperture 168 for accepting and supporting an end of the first conductive lead 120 proximal to the resistive element 126. Structurally, the resistive element 126 is centered and supported by a combination of the disc-shaped insulator or lead aligner 118 at one end and the conical surface 161 at the other end. The first cavity 160 centers the resistive element 126 such that the first conductive lead 120 is coaxially aligned with the elongate axis 134A of the interface port 134. Additionally, the second conductive lead aperture 168 facilitates the re-direction of the second conductive lead 122 by bending the lead 122, along the arcuate portion 146, one hundred and eight degrees)(180°) immediately aft of the base wall 167 of the first cavity 160. The arcuate portion 146 is configured to re-direct the forward end 148 of the second conductive lead 122 into juxtaposed relation with the threaded external outer surface 138 of the interface port 134.

In the described embodiment, the second cavity 162 comprises an internally threaded coupling surface 154 configured to engage the threaded external outer surface 138 of the interface port 134. While a threaded coupling interface is depicted and described, it will be appreciated that other coupling interfaces are contemplated. For example, an axial "push-on" type interface may be employed wherein a plurality of spring-biased tabs engage the threaded external outer surface 138 of the interface port 134. Additionally, the external outer surface 138 of the interface port 134 may define a first friction surface (not shown) for engaging a second friction surface (also not shown) formed along the threaded internal peripheral surface 154 surface 154 of the resistor holder 108.

Figure 12:
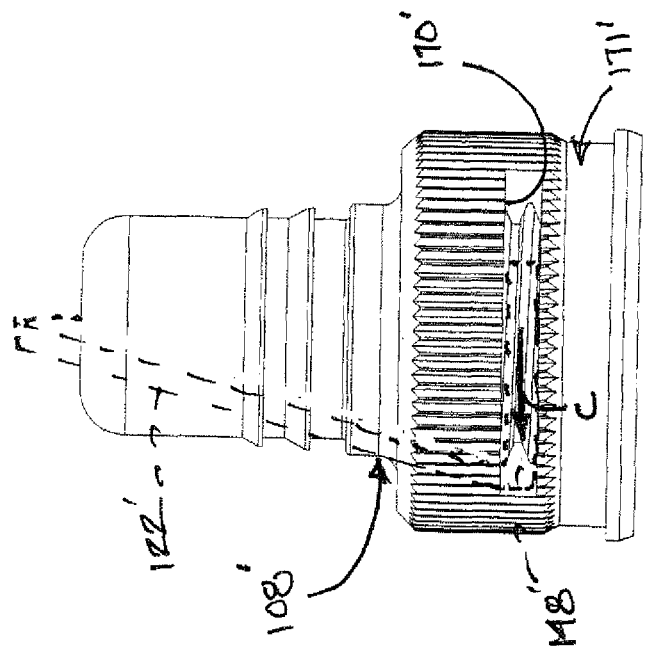
FIG. 12 is an enlarged isolated side view of another embodiment of the resistor holder wherein the forward cavity includes a circumferential slot.
Figure 11:
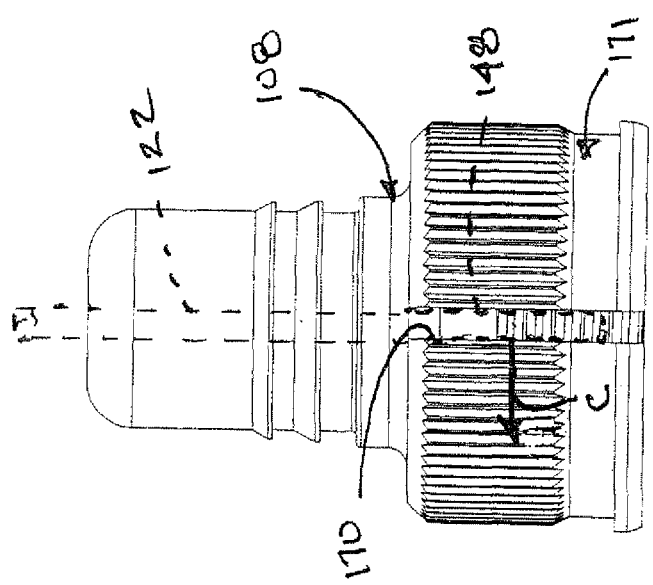
FIG. 11 is an enlarged isolated side view one embodiment of the resistor holder wherein a forward cavity thereof includes an axial slot.

In FIGS. 9, 10 and 11, the second cavity 162 may also comprise a channel or slot 170 formed through the cylindrical wall 171 of the second cavity 162. Functionally, the channel or slot 170 accepts and holds and guides the forward portion 148 of the second conductive lead 122 in juxtaposed relation to the external outer surface 138 of the interface port 134. Further, the channel or slot 170 may additionally drive the forward portion 148 of the second conductive lead 122 in a circumferential direction C as the resistor holder 108 threadably or rotationally engages the threaded external outer surface 138 of the interface port 134. In FIG. 11, the slot 170 is oriented axially and cut through the entire length of the cylindrical wall 171. The axial cut is sized to receive the entire forward portion 148 of the second conductive lead 122. In FIG. 12, another embodiment of the resistor holder 108' depicts a circumferential slot 170' cut through a portion of the cylindrical wall 171'. In this embodiment, the slot 170' is sized to receive a tangential portion 148' of the second conductive lead 122'. In other embodiments, the slots 170, 170' may be sufficiently large to accommodate non-uniform bends in the second conductive lead 122, 122' which may occur during manufacturing.

The resistor driver or resistor engager 112 includes: (i) a cylindrical bore 180 for receiving the resistor holder 108, (ii) one or more driver elements or axial ridges 182 on an internal wall 184 of the cylindrical bore 180, (iii) a plurality of ridges, hex-surfaces, or other torque drive surfaces 185 to facilitate hand or tool tightening of the terminating device 100 in combination with the interface port 134, and (iv) an engagement surface 190 operative to urge or react a force in a direction which causes the forward portion 148s of the second conductive lead 122 to move radially inward to an engaged state or termination position. In the termination position, the forward portion 148s is forcibly engaged with the threaded external outer surface 138 of the interface port 134.

With respect to the latter, the resistor engager 112 cooperates with the resistor holder 108 to direct the forward portion 148 of the second conductive lead 122 against an outer surface 138 of the interface port 134. More specifically, the guide surface 130 of the resistor engager 112 guides the second conductive lead 122 radially outward and axially forward toward the interface port 134. The forward end of the resistor engager 112, furthermore, defines the engagement surface 190 which, depending upon the geometry employed, either: (i) forcibly urges the forward portion 148 of the second conductive lead 122 against the external outer surface 138 of the interface port 134 or (ii) limits the radial motion of the forward portion 148. As a result, the engagement surface 190 either directly or indirectly provides the intensifying force along the coupling interface.

With respect to the former, the circumference or diameter of the engagement surface 190 may be prescribed/predetermined to press the forward portion 148 of the second conductive lead 122 against the external outer surface 138 of the interface port 134. In this embodiment, the forward portion 148 of the second conductive lead 122 may be linear and does not necessarily include an inwardly-curved, spring-biased end portion 152. As such, manufacturing tolerances can be controlled to ensure that sufficient force is applied while still allowing coupling rotation of the terminating device 100. It will be appreciated that too much force can prevent the orbiting motion of the second conductive lead 122 when the terminating device 100 threadably engages the interface port 134.

With respect to the latter, the engagement surface 190 limits the radial motion of the forward portion 148 of the second conductive lead 122 to intensify the force applied at the coupling interface of the terminating device 100 and the interface port 134. In this embodiment, the inwardly-curved, spring-biased end portion 152 produces the radial force necessary to intensify the electrical contact between the forward portion 148 of the second conductive lead 122 and the outer coupling surface of the interface port 134. By limiting the radial motion, the engagement surface 190 indirectly applies the intensifying radial force, while the spring-biased end portion 152 directly applies the intensifying force along the coupling interface.

A sealing cap 116 may optionally be included at the forward end of the terminating device 100. The sealing cap 116 may include a lip 194 which interposes a first rim 196 of the resistor holder 108 and a second rim 198 of the resistor engager 112. Functionally, the cap 116 seals the connection between the terminating device 100 and the interface port 134 to prevent environmental ingress, unwanted debris, water and the like from interfering with the connection.

As assembled, the first conductive lead 120 of the terminating device 100 is centered within the first or forward cavity 160 of the resistor holder 108. The second conductive lead 122 is bounded on two sides thereof by the slot 170 of the holder 108 and along the radially outboard peripheral surface 148S, i.e., the top-side, of the second conductive lead 122122 by the engagement surface 190 of the resistor engager 112.

When installed, the first conductive lead 120 electrically engages the inner conductor 144 of the interface port 134 and the second conductive lead 122 electrically engages the outer conductor 150 of the interface port. The first conductive lead 120 is axially aligned with, and inserted into, the conductive aperture 136 of the interface port 134. Furthermore, the inwardly-curved, spring-biased end portion 152 of the second conductive lead 122 engages the external outer surface 138 of the interface port.

More specifically, when engaging a threaded interface port 134, the resistor engager 112 receives the resistor holder 108 such that the driver elements 182 of the resistor engager 112 engage the axial grooves 163 of the resistor holder 108. The external peripheral ridges or hexed-surface 180 may be used to transfer torque to the resister engager 112. Hence, the terminating device 100 may be hand-tightened or rotated with the aid of a conventional wrench or ratchet tool. Rotation of the resistor holder 108 causes the threads 154, formed along the internal peripheral surface of the first or forward cavity 162, to threadably engage the threaded external outer surface 138 of the interface port 134. Furthermore, the first conductive lead 120 moves axially into the conductive aperture 136 while the second conductive lead 122 orbits about the first conductive lead 120 as the threads 154 of the resistor holder 108 engage the threads 138 of the interface port 134. In addition to rotational motion, the forward portion 148 of the second conductive lead 122 follows the first conductive lead 120 axially toward the interface port 134. The axial motion of the second conductive lead 122 causes the forward portion 148 to move radially outboard in a direction D, as a consequence of the inwardly-curved, spring-biased portion 152 engaging the threaded outer coupling surface 138 of the interface port 134. The radial outboard displacement is, however, limited by the engagement surface 190190 which engages the outboard peripheral surface 148s 148s of the second conductive lead 122. By limiting the outboard motion D, the engagement forces developed between the spring-biased portion 152 and threaded outer surface 138 of the interface port 134 are intensified to augment the electrical contact and continuity therebetween.

When engaging a non-threaded interface port (not shown),), the terminating device 100 is displaced axially into or over the interface port such that the first conductive lead 120 is inserted into the conductive aperture 136 and the second conductive lead 122 slides over a non-threaded coupling surface. Notwithstanding the absence of a threaded external outer surface 138, the inwardly-curved, spring-biased portion 152 engages the coupling surface and the engagement surface 190190 of the resistor engager 112 limits the outboard radial motion D of the second conductive lead 122. When fully engaged, the engagement surface 190190 and the spring-biased portion 152 of the second conductive lead 122 intensifies the engagement forces therebetween to improve the electrical contact between the resistor 104 and the interface port.

While, in the described embodiment, the resistor holder 108 includes a retention cavity 162 for securing and centering the resistive element 126, it will be appreciated that the retention cavity 162 may be formed in combination with the resistor engager 112. Furthermore, while the resistor holder 108 includes a channel or slot 170, it will be appreciated that the channel or slot 170 may be formed in combination with an inner surface of the resistor engager 112. That is, the guide surface 130 may transition to form a channel (not shown) in the forward end of the resistor engager 112.

In other embodiments, the resistor device 104 is held in place by a means other than the first cavity 160. For example, the resistor device 104 may be held by a structure of the resister engager 112. In another embodiment, the resistor 104 may be housed in a portion of the resistor engager 112 that is adjacent to the cylindrical wall 171. Accordingly, the first conductive lead 120 may be significantly longer and include the arcuate portion 146, while the second conductive lead 122 may be significantly shorter.

Inasmuch as the second conductive lead 122 is configured to directly engage the interface port 134, i.e., once the terminating device 100 has been assembled, there is no requirement for resistor holder 108 to be part of, or in, the signal path. Therefore, the resistor holder 108 may be fabricated from either conductive or non-conductive materials. Consequently, a portion of the terminating device 100, i.e., the resistor holder 108, may be fabricated from a wide variety of materials to provide greater design flexibility offering the potential to reduce the cost of manufactured manufacturing cost.

Moreover, because the channel or slot 170 allows for direct contact between the second conductive lead 122 and the threaded external outer surface 138 of the interface port 134, the need to solder the resistor 104 is entirely eliminated.

Additional embodiments include any one of the embodiments described above, where one or more of its components, functionalities or structures is interchanged with, replaced by or augmented by one or more of the components, functionalities or structures of a different embodiment described above.

It should be understood that various changes and modifications to the embodiments described herein will be apparent to those skilled in the art. Such changes and modifications can be made without departing from the spirit and scope of the present disclosure and without diminishing its intended advantages. It is therefore intended that such changes and modifications be covered by the appended claims. Although several embodiments of the disclosure have been disclosed in the foregoing specification, it is understood by those skilled in the art that many modifications and other embodiments of the disclosure will come to mind to which the disclosure pertains, having the benefit of the teaching presented in the foregoing description and associated drawings. It is thus understood that the disclosure is not limited to the specific embodiments disclosed herein above, and that many modifications and other embodiments are intended to be included within the scope of the appended claims. Moreover, although specific terms are employed herein, as well as in the claims which follow, they are used only in a generic and descriptive sense, and not for the purposes of limiting the present disclosure, nor the claims which follow.

The following is claimed:

1. An interface terminating device comprising:
   a resistor device comprising a first conductive lead, a second conductive lead and a resistive element between the first and second conductive leads, the first conductive lead extending from the resistive element in a first direction to engage an inner conductor of an interface port, and the second conductive lead extending from the resistive element in a second direction to engage an outer conductor of the interface port, the second conductive lead being guided such that a peripheral surface thereof is juxtaposed and engages a surface of the interface port about an axis,
   a resistor holder defining a coupling surface, a slot formed in the coupling surface, and at least one retention cavity configured to: (i) secure the resistor device, (ii) coaxially align the first conductive lead with an axis of the interface port, and (iii) direct the second conductive radially outboard from the axis of the interface port such that a forward portion of the second conductive lead may be directed into the slot, and
   a resistor engager having an opening for at least partially receiving the resistor holder, the resistor engager driving the resistor holder forwardly such that the first conductive lead axially engages a conductive aperture of the interface port, the conductive aperture electrically engaging the inner conductor of the interface port, the resistor engager furthermore having a guide surface configured to engage a forward portion of the second conductive lead into the slot of the resistor holder and an engagement surface configured to urge a peripheral surface of the forward portion against an outer surface of the interface port, the peripheral surface electrically engaging the outer surface of the interface port.

2. The interface terminating device of claim 1, wherein the slot of the resistor holder is oriented axially relative to an axis of the interface port, wherein an internal surface of the resistor holder defines a plurality of threads, wherein the external surface of the resistor holder defines a plurality of axial grooves, and wherein the resistor engager includes at least one driver element projecting inwardly toward the axis of the interface port, the driver element engaging at least one of the axial grooves to rotate the resistor holder about the rotational axis such that as resistor holder is rotated, the internal threads of the resistor holder engage external threads of the interface port causing the second conductive lead to orbit the outer peripheral surface of the interface port, the resistor engager, furthermore, forcibly urging the forward portion of the second conductive lead against the threaded outer surface of the interface port to augment the electrical connection therebetween.

3. The interface terminating device of claim 1, wherein the slot of the resistor holder is directed circumferentially, wherein an internal peripheral surface of the resistor holder defines a plurality of threads, wherein the external peripheral surface of the resistor holder defines a plurality of axial grooves, and wherein the resistor engager includes at least one driver element projecting inwardly toward the axis of the interface port, and wherein rotation of the resistor holder causes the second conductive lead to orbit the outer peripheral surface of the interface port, the resistor engager, furthermore, forcibly urging the forward portion of the second conductive lead against the threaded outer surface of the interface port to augment the electrical connection therebetween.

4. An interface terminating device, comprising:
a resistor device configured to be in electrical communication with inner and outer conductors of an interface port, the resistor device comprising a resistive element disposed between a first conductive lead and a second conductive lead; and
a housing comprising resistor holder and resistor engager portions;
the resister holder portion having an opening configured to receive at least a portion of the resistor device, and direct the first conductive lead into an aperture electrically engaging the inner conductor of the interface port; and
the resistor engager portion cooperating with the resistor holder portion to direct the second conductive lead against an outer surface of the interface port to electrically engage the outer conductor of the interface port;
wherein at least one of the portions of the housing effects electrical engagement of a lead of the resistor device to a surface of the interface port without soldering the other lead of the resistor device to the other portion of the housing.

5. The interface terminating device of claim 4, wherein the resistor engager portion juxtapositions the second conductive lead against the outer surface of the interface port.

6. The interface terminating device of claim 4, wherein the resistor engager portion redirects the second conductive lead from a first direction away from the interface port to a second direction toward the interface port.

7. The interface terminating device of claim 4, wherein the resistor holder portion includes a slot providing access to the outer surface of the interface port, wherein the resistor engager portion includes a guide surface to direct the second conductive lead into the slot, and wherein the resistor engager portion includes an engagement surface to urge a forward portion of the second conductive lead against the outer surface of the interface port.

8. The interface terminating device of claim 7, wherein the slot is disposed through a wall of the resistor holder and is oriented axially along an elongate axis of the port.

9. The interface terminating device of claim 7, wherein the slot is disposed through a cylindrical wall of the resistor holder and is oriented circumferentially through the cylindrical wall.

10. The interface terminating device of claim 4, wherein the outer surface of the interface port comprises one of a friction surface and a threaded surface.

11. An interface terminating device comprising:
a resistor comprising a first conductive lead, a second conductive lead and a resistive element between the first and second conductive leads;
a resistor holder configured to receive the resistor, the resistor holder configured to hold the resistor so that the first conductive lead is directed to engage an inner conductor of a coaxial interface port; and
a resistor engager configured to engage the second conductive lead to force the second conductive lead into engagement with the outer conductor of the coaxial interface port.

12. The interface terminating device of claim 11, wherein the resistor holder and resistor engager cooperate to juxtaposition the second conductive lead against an outer surface of the interface port.

13. The interface terminating device of claim 11, wherein the body redirects the second conductive lead from a first direction away from the interface port to a second direction toward the interface port.

14. The interface terminating device of claim 13, wherein the second conductive lead is juxtaposed relative to an outer surface of the interface port.

15. The interface terminating device of claim 11, wherein an outer surface is a threaded surface.

16. The interface terminating device of claim 11, wherein an outer surface comprises a friction surface.

17. The interface terminating device of claim 13, wherein the resistor holder includes a slot: (i) receiving the first conductive lead, and (ii) extending axially across a threaded outer surface of the interface port.

18. The interface terminating device of claim 13, wherein the resistor holder includes a slot for: (i) receiving the first conductive lead and (ii) extending circumferentially along a threaded surface of the interface port.

19. The interface terminating device of claim 11, further comprises a cap connecting to an end of the resistor engager and enveloping the interface port to effect an environmental seal therebetween.

20. The interface terminating device of claim 11, wherein one of the first and second conductive leads is flexible.

21. An interface port terminator for forming a solder-less electrical connection between a resistor and an interface port comprising:

a resistor including a first conductive lead, a second conductive lead, and a resistive element disposed between the first conductor lead and the second conductor lead; and a resistor engager configured to form a first solder-less electrical connection between the first conductive lead and an inner conductor of an interface port and a second solder-less electrical connection between the second conductive lead and an outer conductor of the interface port when the resistor engager is assembled on the interface port.

22. The interface port terminator of claim 21, wherein the first conductive lead is aligned with a central axis of the interface port to be received by a center conductor aperture thereof wherein the second conductive is directed outwardly into contact with an outer surface of an interface port.

23. The interface port terminator of claim 21, wherein the resistor engager includes a resistor holder having a coupling surface, a slot formed in the coupling surface, and at least one retention cavity configured to coaxially align the first conductive lead with an axis of the interface port, and configured to direct the second conductive radially outward from the axis of the interface port so as to direct a forward portion of the second conductive lead into the slot during assembly.

24. The interface port terminator of claim 23, wherein the resistor engager includes a resistor holder having a coupling surface, a slot formed in the coupling surface, and at least one retention cavity configured to coaxially align the first conductive lead with an axis of the interface port, and configured to direct the second conductive radially outward from the axis of the interface port so as to direct a forward portion of the second conductive lead into the slot during assembly.

25. The interface port terminator of claim 24, wherein the resistor engager includes a resistor engager configured to engage the resistor holder such that the first conductive lead axially engages a conductive aperture of the interface port and such that the conductive aperture electrically engages the inner conductor of the interface port during assembly.

26. The interface port terminator of claim 25, wherein the resistor engager includes a guide surface configured to direct a forward portion of the second conductive lead into the slot of the resistor holder during assembly, and an engagement surface configured to urge a peripheral surface of the forward portion of the second conductive lead against an outer surface of the interface port during assembly such that the peripheral surface of the forward portion of the second conductive lead electrically engages the outer surface of the interface port.

27. The interface port terminator of claim 26, wherein the slot of the resistor holder is oriented axially relative to an axis of the interface port, an internal surface of the resistor holder includes a plurality of threads, the external surface of the resistor holder includes a plurality of axial grooves, and the resistor engager includes at least one driver element projecting inwardly toward the axis of the interface port.

28. The interface port terminator of claim 27, wherein the driver element is configured to engage at least one of the axial grooves to rotate the resistor holder about a rotational axis such that as the resistor holder rotates, the internal threads of the resistor holder engage external threads of the interface port causing the second conductive lead to orbit the outer peripheral surface of the interface port, and the resistor engager forcibly urges the forward portion of the second conductive lead against the threaded outer surface of the interface port to augment the electrical connection therebetween.

* * * * *